United States Patent [19]
Hiraga

[11] Patent Number: 6,151,199
[45] Date of Patent: Nov. 21, 2000

[54] SEMICONDUCTOR INTEGRATED CIRCUIT DEVICE

[75] Inventor: Noriaki Hiraga, Kyoto, Japan

[73] Assignee: Rohm Co., Ltd., Kyoto, Japan

[21] Appl. No.: 09/112,457

[22] Filed: Jul. 9, 1998

[30] Foreign Application Priority Data

Jul. 10, 1997 [JP] Japan .................................. 9-184744

[51] Int. Cl.$^7$ .................................................. H02H 9/00
[52] U.S. Cl. ............................................................. 361/56
[58] Field of Search ...................... 361/56, 111; 326/82, 326/83, 86, 112, 121

[56] References Cited

U.S. PATENT DOCUMENTS 4,930,036  5/1990  Sitch ........................................ 361/56
5,731,940  3/1998  Minogue ................................. 361/56

*Primary Examiner*—Ronald W. Leja
*Attorney, Agent, or Firm*—Arent Fox Kintner Plotkin & Kahn PLLC

[57] ABSTRACT

A semiconductor integrated circuit device has an open-drain-type output circuit in which an N-channel transistor has its source connected to a reference potential point and has its drain connected to an output terminal. The drain of the N-channel transistor is connected to the source of a P-channel transistor. The P-channel transistor has its source and gate connected together through a resistor, and has its drain connected to the reference potential point.

4 Claims, 3 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and particularly to a semiconductor integrated circuit device having an open-drain-type output circuit in which an N-channel transistor has its source connected to a reference potential point and has its drain connected to an output terminal.

2. Description of the Prior Art

Conventionally, a semiconductor integrated circuit device is typically provided with an output circuit of a CMOS type as shown in FIG. 3, or of an open-drain type as shown in FIG. 4. In FIG. 3, the output circuit has an input terminal 90 that is connected to a driving circuit provided within the semiconductor integrated circuit device.

This circuit has a P-channel MOS transistor 102 of which the gate is connected to the input terminal 90, the source is connected to a power source line 101, and the drain is connected to an output terminal 100. The circuit also has an N-channel MOS transistor 103 of which the gate is connected to the input terminal 90, the source is connected to ground, and the drain is connected to the output terminal 100. In this circuit, when a high level is fed to the input terminal 90, the transistor 102 is turned off, and the transistor 103 is turned on, causing a low level to appear at the output terminal. By contrast, when a low level is fed to the input terminal 90, the transistor 102 is turned on, and the transistor 103 is turned off, causing a high level to appear at the output terminal 100.

On the other hand, in FIG. 4, the output circuit has an input terminal 90, and has an N-channel MOS transistor 104 of which the gate is connected to the input terminal 90, the source is connected to ground, and the drain is connected to an output terminal 100. In this circuit, when a high level is fed to the input terminal 90, the transistor 104 is turned on, causing a low level to appear at the output terminal 100. However, when a low level is fed to the input terminal 90, the transistor 104 is turned off, and this brings the output terminal 100 into an electrically floating state.

When a person touches the output terminal 100 with his or her hand while the circuit is not in operation, or for some other reason, the output terminal 100 may receive an abnormally high electrostatic voltage. In the circuit shown in FIG. 3, where the power source line 101 is kept at the ground level when the circuit is not in operation (i.e. not in use), such an electrostatic voltage causes punch-through, which allows a current to flow through the P-channel MOS transistor 102 and then via the power source line 101 to ground. As a result, the incidence of destruction of the transistor is relatively low. This current due to punch-through does not always serve to discharge a sufficient amount of electric charge, and therefore it does not provide sufficient protection for the transistor. Nevertheless, this still helps protect the transistor against an electrostatic voltage unless the voltage is extremely high.

By contrast, in the circuit shown in FIG. 4, where there is no route to bypass (discharge) static electricity, a current destroys the transistor 104 as it flows therethrough to ground. Thus, an output circuit of the open-drain type is said to have low resistance to static electricity.

SUMMARY OF THE INVENTION

An object of the present invention is to provide a semiconductor integrated circuit device that provides satisfactory protection against static electricity despite having an open-drain-type output circuit.

To achieve the above object, according to the present invention, a semiconductor integrated circuit device has an open-drain-type output circuit in which an N-channel transistor has its source connected to a reference potential point and has its drain connected to an output terminal. In this device, the drain of the N-channel transistor is connected to the source of a P-channel transistor; the P-channel transistor has its source and gate connected together through a resistor, and has its drain connected to the reference potential point.

In this device, the above-mentioned P-channel transistor is formed within an N well formed in a P-type semiconductor substrate, and, within this N well, an $N^+$ ring layer is formed around the P-channel transistor. The gate electrode of the P-channel transistor is coupled to the N well, and a pad serving as the output terminal is connected to the $N^+$ ring layer and to the drain region with wires. Thus, the resistance of the N well is used as the above-mentioned resistor between the gate and source.

In this structure, when static electricity is applied to the output terminal such that a positive surge appears there, the gate and the substrate of the P-channel MOS transistor are brought out of their stable state. This change occurs with a delay with respect to the similar change in the source. As a result, there appears a period in which the gate voltage is lower than the source voltage, and, during this period, the P-channel MOS transistor is turned on. This causes the charge present at its source (i.e. at the output terminal) to flow to the drain. The charge (current) then continues to flow from the drain to ground. On the other hand, the charge is made to flow to the drain also by the punch-through that occurs between the source and drain of the transistor, and then to ground. In this way, it is possible to securely prevent the destruction of an open-drain transistor (N-channel MOS transistor) caused by an electrostatic voltage applied from the outside (even when the voltage is considerably high).

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
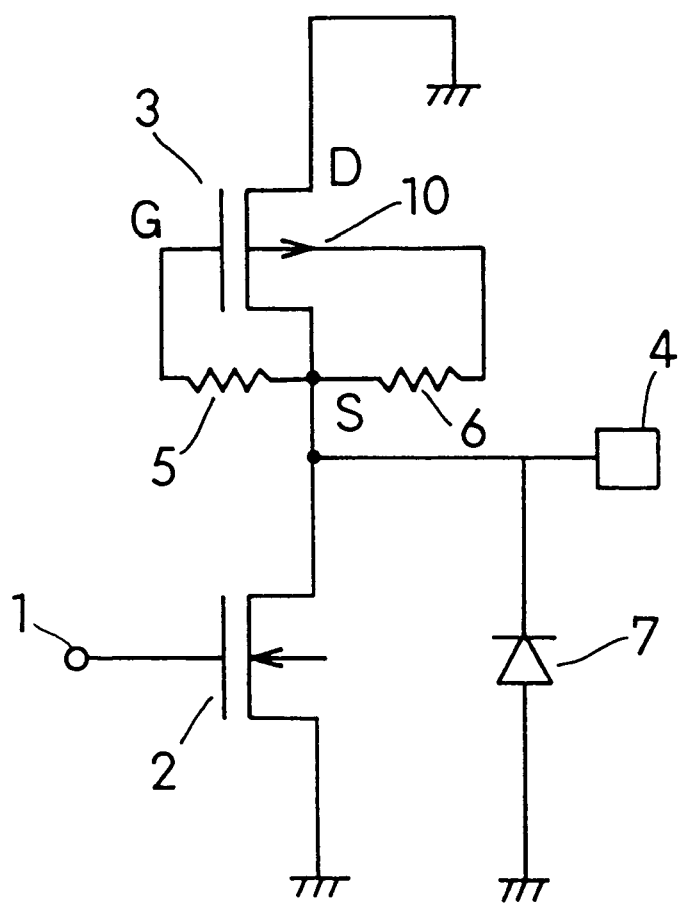
FIG. 1 is a circuit diagram of the output circuit employed in a semiconductor integrated circuit device according to the present invention.

FIG. 1 is a circuit diagram of the output circuit of a semiconductor integrated circuit device embodying the present invention. In FIG. 1, numeral 1 represents an input terminal of the output circuit, and numeral 2 represents an N-channel MOS transistor having its gate connected to the input terminal, having its source connected to ground (the reference potential point), and having its drain connected to an output terminal 4. This N-channel MOS transistor 2 functions as an open-drain output circuit. Specifically, when a high level is fed to the input terminal 1, the N-channel MOS transistor 2 is turned on, causing a low level to appear at the output terminal 4; when a low level is fed to the input terminal 1, it is turned off, bringing the output terminal 4 into an electrically floating state.

As shown in the figure, this N-channel MOS transistor 2 has its drain connected also to the source S of a P-channel MOS transistor 3 that provides protection against static electricity. The P-channel MOS transistor 3 has a resistor 5 connected between its source S and gate G. Moreover, the P-channel MOS transistor 3 has its substrate 10 coupled to its source S (with a resistor 6 formed in between). Furthermore, this transistor 3 has its drain D connected to ground.

Figure 2:
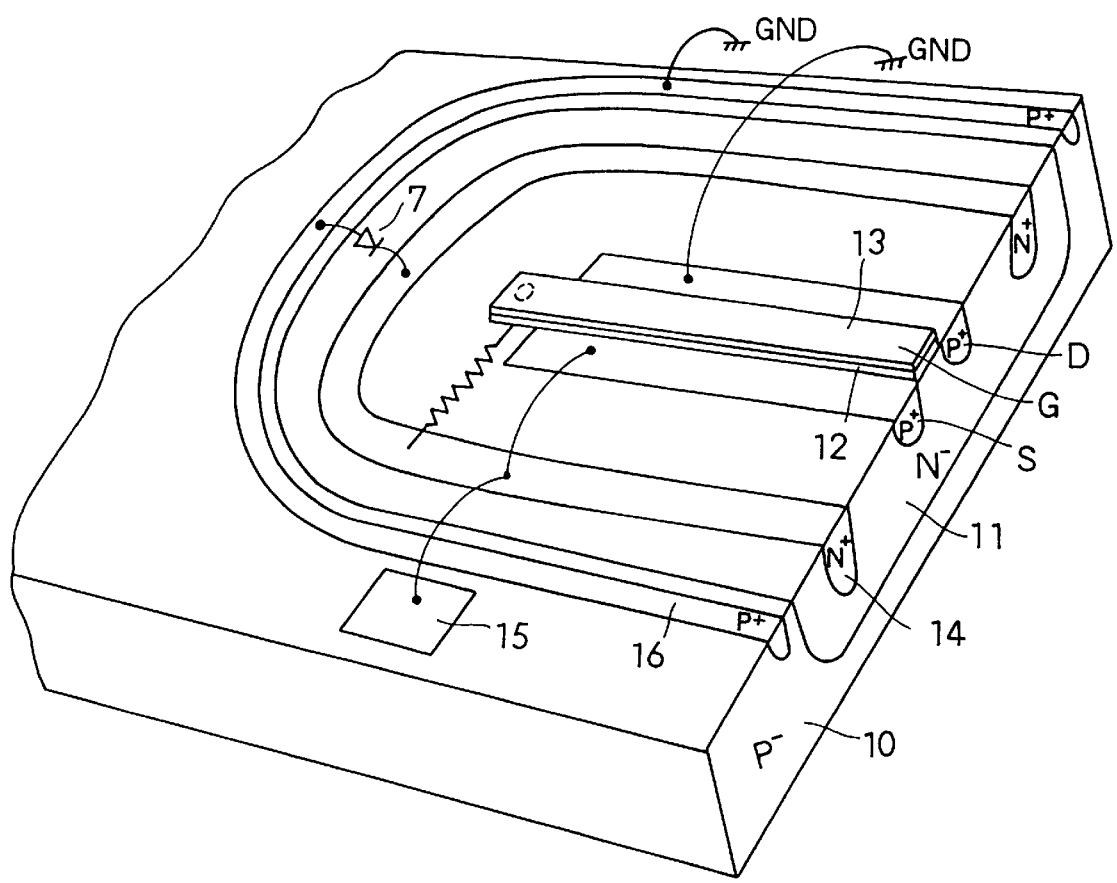
FIG. 2 is a diagram schematically illustrating the structure of a part of the semiconductor integrated circuit device of the invention.
Figure 3:
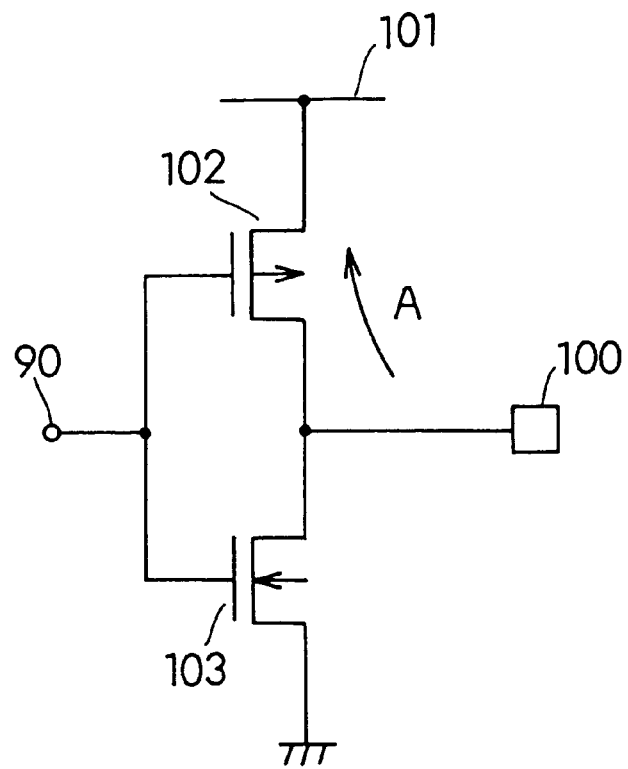
FIG. 3 is a diagram illustrating a conventional output circuit.
Figure 4:
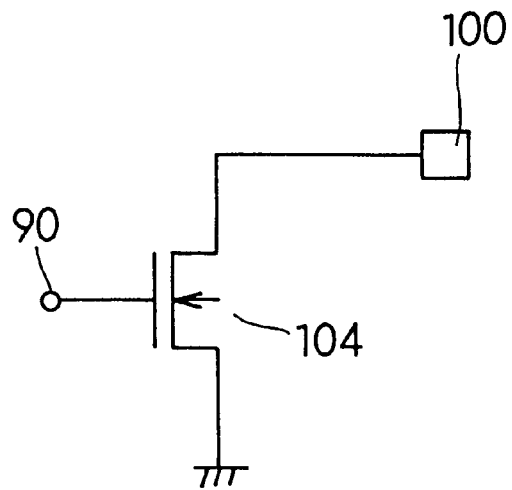
FIG. 4 is a diagram illustrating another conventional output circuit.

The P-channel MOS transistor 3 provides electrostatic protection in the following manner. When an abnormal electrostatic voltage (a positive surge) is applied to the output terminal 4, the gate G and the substrate 10 of the transistor 3 are brought out of their stable state. This change occurs with a delay with respect to the similar change in the source S. Thus, during this delay time, the gate voltage is kept lower than the source voltage, and accordingly the transistor 3 is turned on. This causes the charge at the output terminal 4 to flow through the source-drain channel of the transistor 3 into ground. On the other hand, the charge is made to flow into ground also by the punch-through that occurs between the source S and the drain D. In this way, the transistor 2 is securely protected from destruction that may result from a positive electrostatic voltage. By contrast, when an abnormal negative electrostatic voltage is applied to the output terminal 4, the diode 7 is turned on, and thereby the transistor 2 is protected from destruction FIG. 2 schematically shows the structure of the above-mentioned transistor 3 and diode 7. In this figure, numeral 10 represents a P-type semiconductor substrate, and numeral 11 represents an N well formed therein; S, G, and D represent regions for the source, gate, and drain, respectively; numeral 12 represents a gate insulating film, and numeral 13 represents a gate electrode laid thereon; numeral 14 represents an $N^+$ ring layer formed within the N well 11; numeral 16 represents a $P^+$ layer formed adjacent to the N well 11, with a diode 7 formed between the $P^+$ layer 16 and the $N^+$ layer 14. This $P^+$ layer 16 is connected to a ground potential point GND.

The gate electrode 13 is, at one end, connected to the N well 11 by way of a contact hole. Numeral 15 represents a pad that serves as the output terminal 4. This pad 15 is connected to the $N^+$ ring layer 14 and then further to the source region S with wires. On the other hand, the drain region D is connected to the ground potential point GND with a wire.

The wires are formed on an insulating film laid on the semiconductor substrate 10, and are connected to their respective destination regions and others by way of contact holes. The ground potential point GND is a point on a ground pattern formed on the insulating film. In the structure described above, the resistor 5 is realized by the use of the resistance of the N well 11 (i.e. the resistance of the N well 11 from the contact point between the gate electrode 13 and the N well 11 to the $N^+$ ring layer); that is, no resistor is expressly formed here.

What is claimed is:

1. A semiconductor integrated circuit device comprising:

an N-channel MOS transistor having a gate to which a signal voltage is applied and having a source connected to a reference potential point;

an output terminal connected to a drain of the N-channel MOS transistor;

a P-channel MOS transistor having a source connected to the drain of the N-channel MOS transistor and having a drain connected to the reference potential point; and a resistor formed between the source and a gate of the P-channel MOS transistor, wherein, when a positive electrostatic charge is applied to the output terminal while the gate of the N-channel MOS transistor is receiving no input voltage and thus the semiconductor integrated circuit is not in operation, the P-channel MOS transistor is turned on so that the electrostatic charge is bypassed to the reference potential point.

2. A semiconductor integrated circuit device as claimed in claim 1, further comprising:

a diode having a cathode connected to the output terminal and having an anode connected to the reference potential point, wherein, when a negative electrostatic charge is applied to the output terminal while the N-channel MOS transistor is off, the diode is turned on so that the negative electrostatic charge is bypassed to the reference potential point.

3. A semiconductor integrated circuit device as claimed in claim 1, wherein the reference potential point is a ground potential point.

4. A semiconductor integrated circuit device as claimed in claim 1, wherein the N-channel MOS transistor constitutes an open-drain-type output circuit in which the N-channel MOS transistor, when a high level is fed to its gate as the input voltage, is turned on to cause a low level to appear at the output terminal, and, when a low level is fed as the input voltage, is turned off to bring the output terminal into an electrically floating state.

* * * * *